United States Patent [19]

Olsen

[11] Patent Number: 4,709,141
[45] Date of Patent: Nov. 24, 1987

[54] NON-DESTRUCTIVE TESTING OF COOLED DETECTOR ARRAYS

[75] Inventor: David E. Olsen, Calabasas, Calif.

[73] Assignee: Rockwell International Corporation, El Segundo, Calif.

[21] Appl. No.: 817,307

[22] Filed: Jan. 9, 1986

[51] Int. Cl.⁴ .............................................. H01J 40/14
[52] U.S. Cl. .............................. 250/211 R; 250/332; 324/158 D
[58] Field of Search ................ 250/211 R, 211 J, 332; 324/158 D, 158 R, 96

[56] References Cited

U.S. PATENT DOCUMENTS

| | | | |
|---|---|---|---|
| 3,902,924 | 9/1975 | Maciolek et al. | 148/1.3 |
| 4,062,107 | 12/1977 | Blackman et al. | 29/628 |
| 4,117,329 | 9/1978 | Kruer et al. | 250/338 |
| 4,126,033 | 11/1978 | Bartoli et al. | 73/15 A |
| 4,197,633 | 4/1980 | Lorenze, Jr. et al. | 29/577 R |
| 4,229,071 | 10/1980 | d'Auria et al. | 350/150 |
| 4,275,407 | 6/1981 | Lorenze, Jr. | 357/30 |
| 4,286,278 | 8/1981 | Lorenze, Jr. et al. | 357/30 |
| 4,318,217 | 3/1982 | Jenner et al. | 29/572 |
| 4,341,012 | 7/1982 | Fripp et al. | 250/332 |
| 4,378,489 | 3/1983 | Chabinsky et al. | 219/543 |
| 4,418,394 | 11/1983 | Tai | 364/746 |
| 4,463,262 | 7/1984 | Contreras | 250/349 |
| 4,480,183 | 10/1984 | Ely et al. | 250/227 |

Primary Examiner—David C. Nelms
Assistant Examiner—Chung K. Seo
Attorney, Agent, or Firm—H. Fredrick Hamann; George A. Montanye; David J. Arthur

[57] ABSTRACT

An apparatus for testing an array of infrared detectors includes a number of optical switches, each of which is individually addressable with light to change its electrical characteristics. Each of the optical switches has a first side and a second side. The first side of each optical switch is adapted to receive a detector of the infrared detector array to be tested. The apparatus also includes an electrode coupled to the second side of each optical switch. Further, the apparatus includes a detector circuit coupled to the electrode and to a probe adapted to be coupled to the infrared detector array for detecting changes in the electrical characteristics of the optical switches and the infrared detector elements in response to light addressing the individual test elements.

18 Claims, 4 Drawing Figures

NON-DESTRUCTIVE TESTING OF COOLED DETECTOR ARRAYS

BACKGROUND OF THE INVENTION

The present invention relates to the testing of arrays of detectors, and specifically, the testing of mosaic arrays of infrared detectors.

Electrical contact to the inner detector elements of infrared mosaic arrays is normally made through individual columns of indium that are fused into the storage wells of silicon charge-coupled-device multiplexer integrated circuits. Current practice is to test all individual elements of the detector arrays following permanent fusion with the silicon integrated circuit.

To date, no procedure or apparatus has been known to test all the individual detector elements of the detector array prior to its fusion with the semiconductor circuit. Probing each individual detector element of the detector array is generally not feasible with today's detector arrays. Current infrared detector arrays have a large number of individual detector elements in an extremely small area. If some significant number of elements of either the detector array or the semiconductor circuit are defective, the complete detector device then is not usable and must be discarded. The exact number of defective elements that may be tolerated depends upon the application to which the detector array is to be put, and will vary accordingly.

The yield (percentage of acceptable devices) for the combined structure is the product of the yield for the detector array and the yield for the semiconductor integrated circuit. For example, if the yield of the detector arrays is 10% and the silicon IC is 20%, the overall yield is only 2%. Thus, the yield of completed devices has been quite small, causing the completed detector structures to be quite expensive.

SUMMARY OF THE INVENTION

The present invention comprises an apparatus and method for electrically and radiometrically testing an array of infrared detectors prior to fusion of the array with a silicon integrated circuit. The present invention allows defective detector arrays to be weeded out in advance, so the overall yield for completed detector structures can be increased.

The apparatus of the invention includes a plurality of optical switches, each of which is individually addressable with light to change its electrical characteristics. Each optical switch has a first side and a second side, and the first side of each switch is adapted to receive a detector of the detector array to be tested. The apparatus further includes an electrode coupled to the second side of each optical switch, and a detector circuit coupled to the electrode and to a probe adapted to be coupled to the array of infrared detectors. The circuit is for detecting changes in the electrical characteristics of an addressed optical switch and the infrared detector in contact with that optical switch.

The invention further includes a method of forming a matrix of solid state optical switches for testing an array of infrared detectors. The method includes depositing on a surface of a sapphire wafer a light absorbing electrically insulating layer, and forming in that light-absorbing layer a plurality of openings, arranged in rows. The method further includes depositing a plurality of substantially optically transparent, electrically conductive strips, each of which is aligned with a row of the openings in the light-absorbing layer. The method further includes the step of depositing a plurality of photoconductive elements on each of the strips, with each photoconductive element aligned with one of the openings in the light-absorbing layer, in addition to depositing an electrically-conductive cap on each of the photoconductive elements.

The invention further includes a method of testing an array of infrared detectors, incorporating a method for aligning the array of detectors with a matrix of solid state optical switches so that each detector is in contact with one of the solid state optical switches. Each optical switch is individually illuminated with light to cause a change in the electrical characteristics in the illuminated optical switch, and the electrical response of the detector that is in contact with the illuminated optical switch.

DETAILED DESCRIPTION OF THE PREFERRED EMBODIMENT THE TEST ARRAY STRUCTURE

Figure 1:
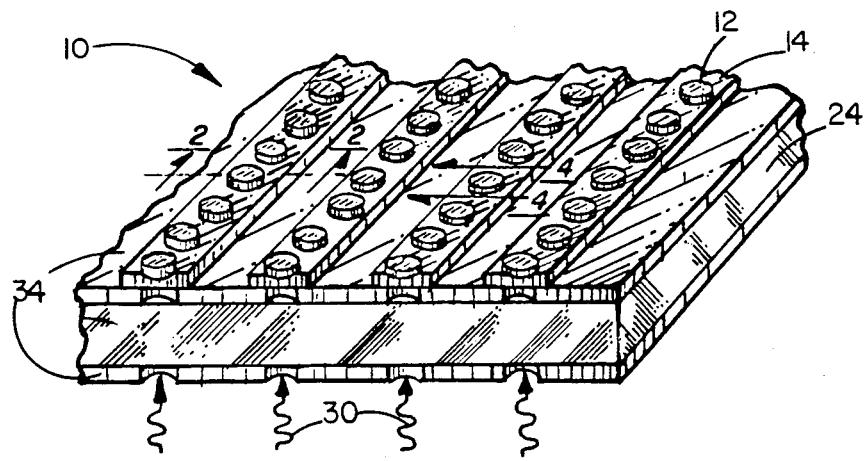
FIG. 1 is a perspective view of a detector array testing device constructed according to the invention.

An array or matrix (10) of test elements (12) suitable for testing a detector array, constructed according to the present invention, is shown in FIG. 1. This test array permits the individual testing of all the detector elements of the infrared mosaic array, including the inner elements, with test probes coupled to the edges of the test array, without individually probing each inner element.

The test elements (12) are normally arranged in rows to coincide with the layout of the detector array. For alternate detector configurations, i.e. spiral, a matching arrangement of the test structure will be fabricated. The test elements are further arranged so that during the test of a detector array each test element corresponds to one of the detector elements of the detector array to be tested. The individual test elements of a row are connected together by an electrode (14). Each electrode extends to the edge of the array, where it may be coupled to a probe that then connects to an amplifier (38) during testing of a detector array. Of major significance is the fact that through this approach, each detector element can be characterized in detail without the contaminating influence on the data of the silicon CCD multiplexer readout circuitry (the transimpedance amplifier (38) can be precisely calibrated such that any mitigating performance limitations of the amplifier can be extracted from this data).

Figure 2:
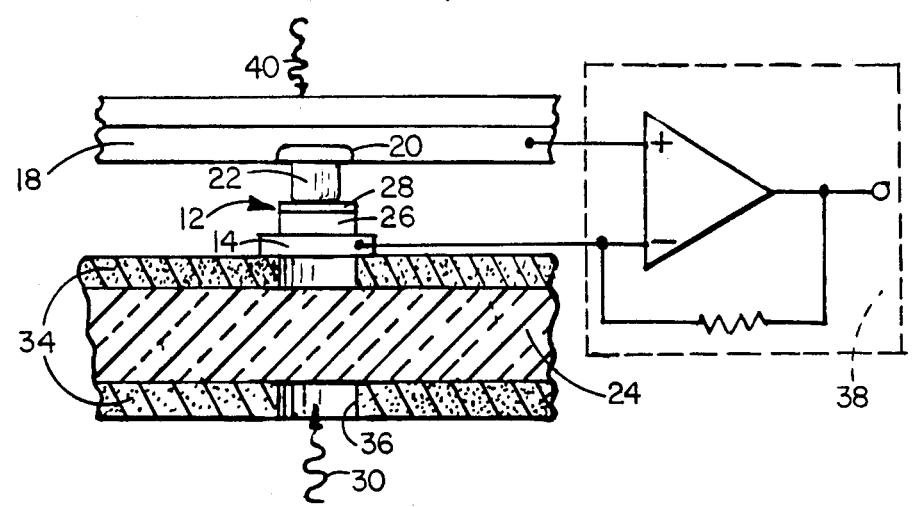
FIG. 2 is a view, partially schematic, and partially in cross-section, taken along line 2—2 of FIG. 1, of a single test element of the testing device constructed according to the invention, contacting a detector element to be tested.

To aid in the understanding of the construction and use of the testing apparatus of the invention, a brief description of the structure of the detector array to be tested is helpful. Referring to FIG. 2, an exemplary element of an infrared detector array such as might be tested with the test matrix of the invention is shown. The detector array comprises a base (16) of cadmium-telluride. An epi layer (18) of mercury-cadmium-telluride (HgCdTe) has formed in it a well (20) to form a diode, which functions as an individual detector element. A column of indium is grown over the well (20) to provide a means for electrical contact (22) to the detector diode. That indium column (22) in the completed detector structure will be fused into a well of a semiconductor matrix, as is known in the art. It should be noted that, although this method was developed for testing HgCdTe arrays, it is equally applicable for testing arrays composed of other materials.

Each test element (12) of the invention corresponds to one of the detector elements of the detector array to be tested. Of interest during testing are the current-/voltage (IV) characteristics of the individual diodes from which the noise characteristics of the detector elements can be approximately calculated. The radiometric properties of the detectors can also be tested using the present invention. Also, although it is more difficult than by inference from the IV measurement, noise can be measured directly using this method.

Figure 3:
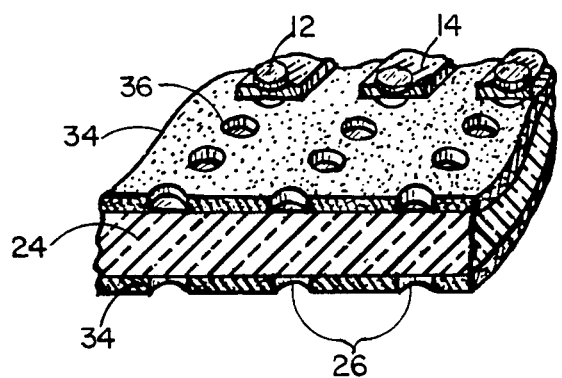
FIG. 3 is a partially cut away view of a section of the substrate portion of the test array structure with the light-absorbing layers on its surfaces.
Figure 4:
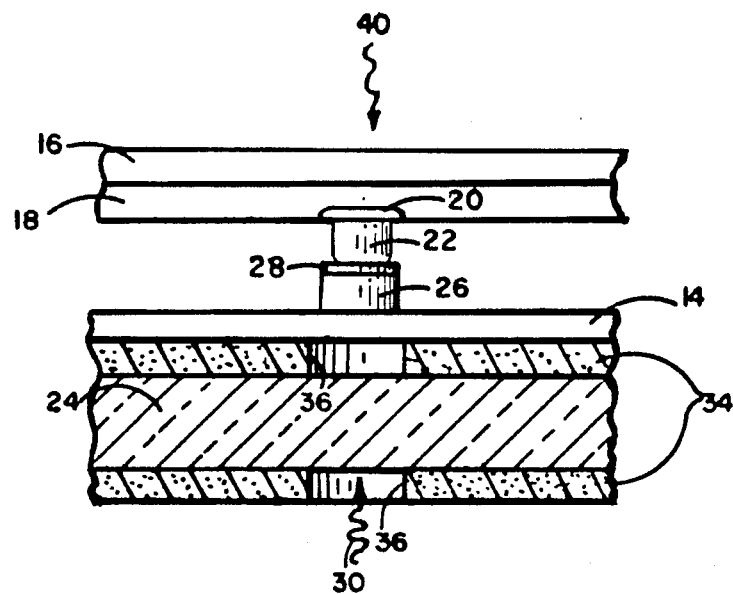
FIG. 4 is a cross-sectional view, taken along line 4—4 of FIG. 1, of a single test element of the testing device constructed according to the invention, contacting a detector element to be tested.

The structure of the test matrix is shown in greater detail in FIGS. 2, 3 and 4. The test structure of the preferred embodiment is built on a substrate (24). The substrate is light-transmissive so that light may be transmitted through the substrate. A transparent substrate is preferred, although a translucent substrate may permit the transmission of sufficient light. A preferred substrate material is sapphire, the features and handling of which are well known in the industry.

Each test element preferably comprises a column (26) of photoconductive material, the electrical conductivity of which increases substantially in response to light. Each photoconductive column (26) forms an individually addressable optical switch. The photoconductive column is preferably formed of cadmium sulfide, the electrical conductivity of which may increase by a factor of $10^6$ in response to light. Other photoconductive materials may also prove suitable.

As illustrated in FIGS. 2 and 4, each photoconductive column (20) is topped or capped on one side with an electrically conductive cap (28). The caps are preferably formed of a metal that will not react with the indium of the detector elements of the infrared detector array during testing. The metal cap (28) on the test element forms an electrical contact between the photoconductor column (26) and the indium column (22) of the detector element being tested.

Each photoconductive column or test element is individually addressable with light (30) from a light source from below the sapphire substrate. The light source may be either a scanned laser or a photodiode matrix. The light individually addresses each photoconductive column (26) through the transmissive substrate (24) so each photoconductive column is an individually addressable optical switch. The light causes a change in the electrical characteristics of the test element. With the preferred photoconductive columns as test elements, the light causes an increase in the conductivity of the addressed column.

The test elements (26) of a row are preferably mounted on a row electrode (14). The second side of the test element, opposite the side having the cap (28) for connecting to a tested detector element, is coupled to the electrode (14) to provide electrical connection between the test element and the electrode. The row electrode is light-transmissive, and preferably transparent, to pass light that is transmitted through the substrate to the photoconductive test element. Each electrode is electrically conductive and extends to the edge of the test array to provide electrical connection between each test element (26) and points at which a test probe may be connected.

At least one side, and preferably both sides of the transmissive substrate (24) are coated with a light-absorbing electrically insulating layer (34). Each light absorbing layer (34) has a plurality of openings (36), each of which corresponds to one of the test element columns (26). A portion of the substrate with an insulating layer on each surface is illustrated in FIG. 3. Portions of the electrodes (14), with their associated photoconductive elements (12), have been removed in FIG. 3 to illustrate the substrate and insulating layer structure. The openings (36) in the insulating layers (34) are preferably round, to correspond to the shape of the test elements, although other shapes may be appropriate. The insulating layer (34) on the two surfaces of the substrate (24) are preferably identical. The openings (36) in the two light absorbing layers on the substrate should align as exactly as possible with each other so that light transmitted through an opening of one layer passes through the corresponding opening of the opposite layer. The electrically insulating light-absorbing layers prevent scattered light from reaching non-addressed detector elements of the detector array being tested. The light-absorbing layer ensures that when the light addresses a single test element, the neighboring elements are not affected, and the test elements may be individually addressed.

Detector circuitry (38) is electrically connectable to the row electrodes (14) of the test array and is adapted to be connectable to the epi layer (18) of the infrared detector array to be tested. The test array detector circuitry (38) detects electrical activity through an optical switch or photoconductive column (26) and the infrared detector (20), (22) connected to that element when that optical switch is addressed by light (30). The optical switch becomes conductive, or closes, due to the change in the electrical characteristics of the photoconductive test element (26) in response to light. The response of the detector diode (20) to infrared radiation (40) can then be tested and evaluated. The detector circuit (38) should be suitable for detecting not only short circuits and open circuits in the detector element diodes (20), but also to measure the response of the diode to different levels of infrared radiation input. The detector circuitry may, for example, be a transimpedance amplifier having an output according to the well-known expression:

$$e_o = I_o \left( e^{\frac{qV_b}{kt}} - 1 \right) + nq\Phi$$

The detector circuitry may have, for example, two probes. One of these probes is adapted to be coupled to the end of one of the transmissive conductive strips or electrodes (14). Such connection may be easily made at the edge of the test array when the electrodes extend to the edge of the array. The other probe may be adapted to be coupled to the mercury-cadmium-telluride epi layer (18) of the detector array being tested.

FORMING THE TEST ARRAY

The test array just described may be constructed in a new method that uses conventional fabrication techniques that are well known in the industry. Beginning with a sapphire wafer (24), the other elements of the detector testing array are deposited thereon.

The light-absorbing electrically insulating layer (34) is deposited informally over at least one surface of the sapphire wafer (24), and preferably over both wafer surfaces. Openings (36) that are to correspond with each test element (26) are formed in the light-absorbing electrically insulating layer (34). Each opening preferably corresponds to a single test element. The openings in the insulating layers on both sides of the sapphire wafer should align with each other. The openings are preferably arranged in rows corresponding to the rows of the detector elements of the detector array to be tested.

Once the openings in the insulator layer have been formed, an optically transparent, electrically conductive strip (14) is deposited over each row of the test element openings, to form the row electrodes.

A photoconductive layer is deposited over the structure thus far developed. As mentioned above, the photoconductive material is preferably cadmium sulfide. Portions of the photoconductive layer are then etched to form the individual photoconductive columns (26) over each of the openings (36) through the electrically insulating layer (34). Finally, the opaque electrically conducting contact (28) is deposited on the top of each photoconductive column.

TESTING A DETECTOR ARRAY

An array of infrared detectors is tested by placing the array in contact with the test element matrix so each detector element contacts one test element. The indium column (22) of each detector element contacts the electrically conductive metallic cap (28) on a corresponding test element photoconductive column (26) to provide electrical contact between the detector element and the test element.

A probe is connected to the column electrode (14) of the test device. A second probe is coupled to the mercury-cadmium-telluride epi layer (18) of the detector array. The detector circuitry (38) is coupled between the two probes to measure electrical activity through the detector elements and test elements of that row.

Each test element is addressed with light from either a scanned laser or a photodiode matrix. The light individually addresses each test element and detector element combination. The light is preferably monochromatic with a wavelength closely conforming to the wavelength of peak photoconductivity. The light absorbing layer (34) surrounding each opening (36) of the test element array effectively prevents scattered light from reaching adjacent test elements. This individual addressing permits particular detector elements of the detector array to be individually tested.

The light is transmitted to the photoconductor column (26) through the essentially transparent sapphire wafer (24) and through the transparent conductor electrode (14). The light causes a large increase in the electrical conductivity of the photoconductive column, which thus results in a large increase in the electrical conductivity between test array electrode and the indium column of the detector array, leading to the diode (20) in the epi layer (18) of the detector array. The increased conductivity of the photoconductive column essentially closes an electrical circuit with the detector element. When the backside of the detector array is illuminated with infrared radiation (40), the infrared or radiometric properties of the detector element (20) can be tested by measuring the electrical response with the detector circuit (38) connected by probes to the epi layer (18) of the detector array and the electrode (14) of the test array.

The electrical response of the detector element diode (20) is detected by the detector circuit (38) connected between the epi layer (18) of the detector array and the transparent electrode (14) of the test array. By varying the bias voltage on the common terminal (noninverting input of the TIA) and measuring the current I.V. characteristics of the individual detector diodes can be measured. A test element not addressed by the light remains essentially an open circuit. If only one test element on a row electrode is addressed at a time, all the other test elements (26) remain nonconductive or open, and a closed circuit is formed to the detector circuit through the row electrode (14), the addressed test element (26), the detector element (20), (22) in electrical contact with that test element, and the detector array epi layer (18).

The test procedures and conditions under which those procedures must be performed will be apparent to those skilled in the art. Detector elements that are open can be detected by testing at room temperature. In addition, some shorts in the detector elements may also be located by testing at room temperature. But, the photoresponse and noise characteristics of the individual detector elements must be tested at the cryogenic temperatures at which the infrared detector array is intended to function. Therefore, to test the detector array fully, it must be cooled to the appropriate cryogenic temperature during testing. Such procedures are known in the art and will differ depending on the specific array to be tested.

The present invention thus permits the detector array to be tested prior to fusing it with the semiconductor integrated circuit. Thus, testing allows defective detector arrays to be discarded without also discarding an associated semiconductor circuit and without incurring the expense of joining the detector array and the integrated circuit.

I claim:

1. An apparatus for testing an array of infrared detectors, comprising:
    a plurality of optical switches, each of which is individually addressable with light to change its electrical characteristics, wherein each of said optical switches has a first side and a second side, and wherein said first side of each of said optical switches is adapted to receive a detector of said array to be tested;
    an electrode coupled to said second side of each of said optical switches; and
    a detector circuit coupled to said electrode and to a probe adapted to be coupled to said array of detectors, said circuit for detecting changes in the electrical characteristics of an addressed optical switch and the infrared detector associated with said addressed optical switch.

2. The apparatus of claim 1 wherein said electrode is transparent and each of said optical switches is addressable by light through said electrode.

3. The apparatus of claim 2 additionally comprising a second plurality of optical switches and a plurality of electrodes, wherein:
said first and second pluralities of optical switches are arranged together in an array corresponding to the detectors of said array to be tested;
each switch of said second plurality of optical switches is individually addressable with light to change its electrical characteristics;
each of said optical switches of said plurality has a first side and a second side;
said first side of each of said optical switches of said second plurality is adapted to receive a detector of said array to be tested; and
said second side of each of the optical switches of said second plurality of optical switches is coupled to one of the electrodes of said plurality of electrodes.

4. The apparatus of claim 3, wherein:
said optical switches of said first plurality of optical switches are arranged in a row;
said optical switches of said first and second plurality of optical switches are arranged in a matrix having a plurality of rows; and
each of said electrodes is coupled to a row of said optical switches.

5. The apparatus of claim 2 wherein each of said optical switches of said first and second pluralities comprises a photoconductive element, the electrical conductivity of which increases in response to light.

6. The apparatus of claim 5 wherein each of said optical switches additionally comprises a metal cap coupled to said first side of said optical switch photoconductive element to provide an opaque electrical contact for a detector of said array of detectors to be tested.

7. The apparatus of claim 1 additionally comprising:
a light-transmissive substrate to which said electrode is coupled; and
a light-absorbing layer coupled to one side of said substrate, wherein said light absorber has a plurality of openings, each corresponding to one of said optical switches.

8. The apparatus of claim 1 wherein said apparatus is for testing an array comprising a plurality of infrared detectors on an epitaxial layer, and wherein said probe is adapted to be coupled to said epitaxial layer of said detector array.

9. A switch matrix for testing an array of individual detector elements, said switch matrix comprising:
a sapphire wafer;
an insulating layer comprising a layer of light absorbing electrically insulating material deposited on said sapphire wafer, said insulating layer having a plurality of openings arranged in rows;
a plurality of light-transmissive, electrically conductive strips coupled to said sapphire wafer, each aligned with a row of said openings;
a plurality of photoconductive columns coupled to each of said electrically conductive strips, wherein each of said columns is aligned with one of said openings;
a plurality of opaque electrically conductive contacts, each of which is coupled to one of said photoconductive columns to provide an electrical contact for a detector element to be tested.

10. The switch matrix of claim 9 additionally comprising a detector circuit adapted to be coupled to at least one of said light transmissive, electrically conductive strips, and to said array of individual detector elements.

11. The switch matrix of claim 9 additionally comprising a light source adapted to individually address each of said photoconductive columns through the corresponding one of said openings in said insulating layer.

12. A method of forming a matrix of solid-state optical switches for testing an array of infrared detectors, the method comprising:
depositing on a surface of a sapphire wafer a light-absorbing electrically insulating layer;
forming in said light-absorbing layer a plurality of openings, arranged in rows;
depositing a plurality of light-transmissive electrically conductive strips, each of which is aligned with a row of said openings; and
depositing a plurality of photoconductive elements on each of said strips, wherein each of said photoconductive elements is aligned with a corresponding one of said openings in said light-absorbing layer.

13. The method of claim 12, additionally comprising depositing an electrically conductive cap on each of said photoconductive elements.

14. The method of claim 12 wherein said step of depositing a plurality of photoconductive elements comprises:
depositing a photoconductive layer over said conductive strips; and
etching away portions of said photoconductive layer to leave a plurality of photoconductive columns forming said photoconductive elements.

15. A method of testing an array of infrared detectors comprising:
aligning said array of detectors with a matrix of solid-state optical switches so that each of said detectors is in electrical contact with one of said solid-state optical switches;
individually illuminating each of said optical switches with light to cause a change in the electrical characteristics of said illuminated optical switch; and
detecting the electrical responsive of the detector that is in electrical contact with said illuminated optical switch.

16. The method of claim 15 wherein said detector array includes an epitaxial layer common to a plurality of said detectors, and a plurality of said optical switches are coupled to a common electrode, wherein said detecting step comprises:
connecting a probe to said epitaxial layer of said infrared detector array; and
connecting a probe to said electrode.

17. The method of claim 16 wherein each of said optical switches is positioned between said electrode and an infrared detector and said illuminating step comprises transmitting light through said electrode to said optical switch.

18. The method of claim 17 wherein said electrode is coupled to a light-transmissive substrate so that said electrode is between said substrate and said optical switches, and wherein said illuminating step further comprises transmitting said light through said substrate and said electrode to said optical switch.

* * * * *